(12) United States Patent
Inaba

(10) Patent No.: US 8,592,925 B2
(45) Date of Patent: Nov. 26, 2013

(54) FUNCTIONAL DEVICE WITH FUNCTIONAL STRUCTURE OF A MICROELECTROMECHANICAL SYSTEM DISPOSED IN A CAVITY OF A SUBSTRATE, AND MANUFACTURING METHOD THEREOF

(75) Inventor: Shogo Inaba, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 122 days.

(21) Appl. No.: 12/351,758

(22) Filed: Jan. 9, 2009

(65) Prior Publication Data

US 2009/0179287 A1   Jul. 16, 2009

(30) Foreign Application Priority Data

Jan. 11, 2008   (JP) ................................. 2008-004037
Nov. 26, 2008   (JP) ................................. 2008-300523

(51) Int. Cl.
*H01L 29/84* (2006.01)

(52) U.S. Cl.
USPC .............................. 257/415; 200/181; 335/78

(58) Field of Classification Search
USPC ....................... 257/414, 415; 200/181; 335/78
See application file for complete search history.

(56) References Cited

U.S. PATENT DOCUMENTS

| | | | |
|---|---|---|---|
| 5,919,364 A | 7/1999 | Lebouitz et al. | |
| 6,635,509 B1 * | 10/2003 | Ouellet | 438/106 |
| 7,368,803 B2 | 5/2008 | Gally et al. | |
| 7,405,924 B2 | 7/2008 | Gally et al. | |
| 2002/0076873 A1 | 6/2002 | Spooner et al. | |
| 2002/0104990 A1 | 8/2002 | DeReus et al. | |
| 2004/0061207 A1 * | 4/2004 | Ding | 257/678 |
| 2004/0166606 A1 * | 8/2004 | Forehand | 438/106 |
| 2005/0189621 A1 * | 9/2005 | Cheung | 257/619 |
| 2006/0017533 A1 * | 1/2006 | Jahnes et al. | 335/78 |
| 2006/0108675 A1 * | 5/2006 | Colgan et al. | 257/684 |
| 2009/0194309 A1 | 8/2009 | Gillot et al. | |

FOREIGN PATENT DOCUMENTS

| | | |
|---|---|---|
| EP | 1 251 099 A2 | 10/2002 |
| FR | 2 901 264 A1 | 11/2007 |
| JP | 2004-314292 A | 11/2004 |
| JP | 2005-010453 A | 1/2005 |
| JP | 2005-147711 A | 6/2005 |
| JP | 2006-099069 A | 4/2006 |
| JP | 2006-119603 A | 5/2006 |
| JP | 2006-263902 A | 10/2006 |

OTHER PUBLICATIONS

Quirk et al.: "Semiconductor Manufacturing Technology"; 2001; Prentice-Hall, Inc.; pp. 305-306.

* cited by examiner

*Primary Examiner* — Allen Parker
(74) *Attorney, Agent, or Firm* — Kilpatrick Townsend & Stockton LLP

(57) ABSTRACT

A functional device includes: a substrate; a functional structure formed on the substrate; a cavity in which the functional structure is disposed; and a cover which covers the cavity, wherein the cover includes a bumpy structure including rib shaped portions, or groove shaped portions, which cross a covering range covering at least the cavity.

12 Claims, 10 Drawing Sheets

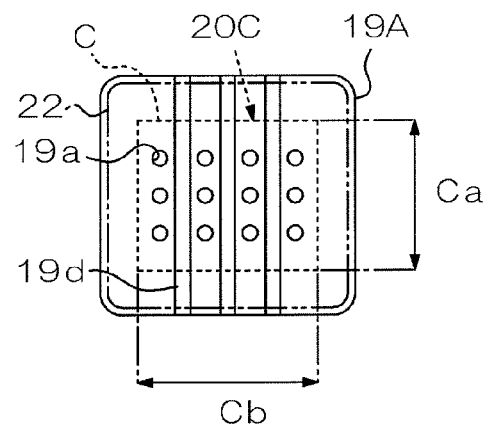
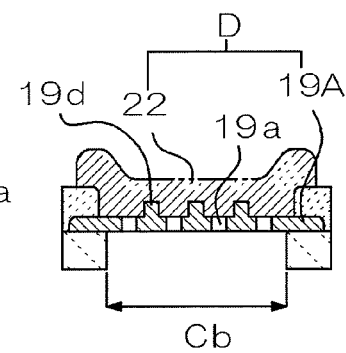
FIG. 3A  FIG. 3B
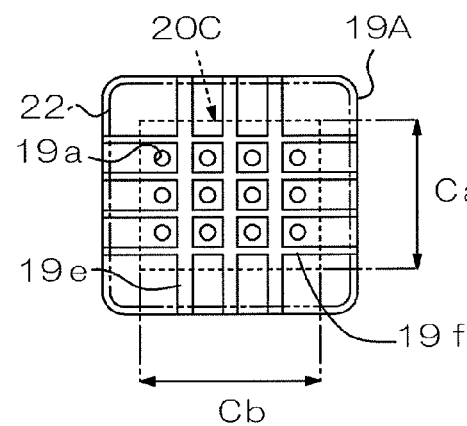
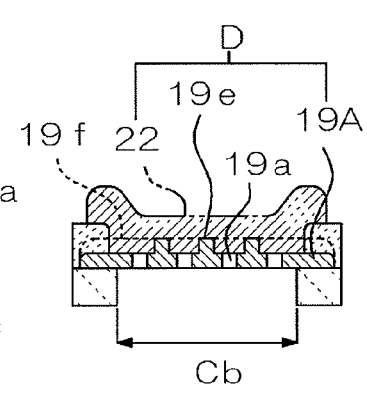
FIG. 4A  FIG. 4B
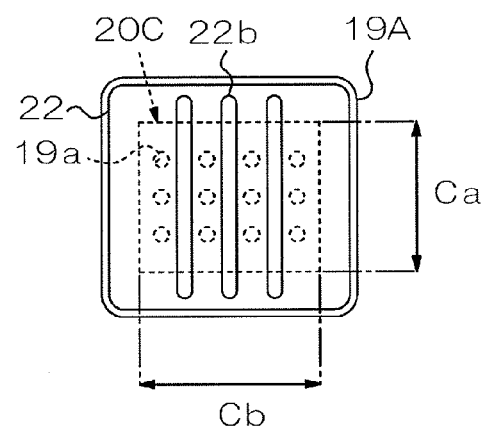
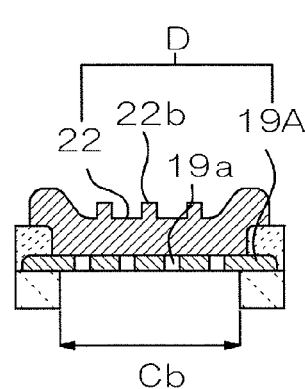
FIG. 5A  FIG. 5B

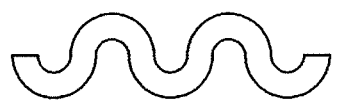
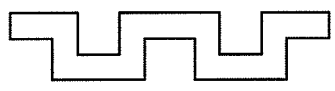
FIG. 6A   FIG. 6B   FIG. 6C
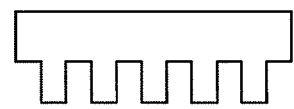
FIG. 6D   FIG. 6E   FIG. 6F
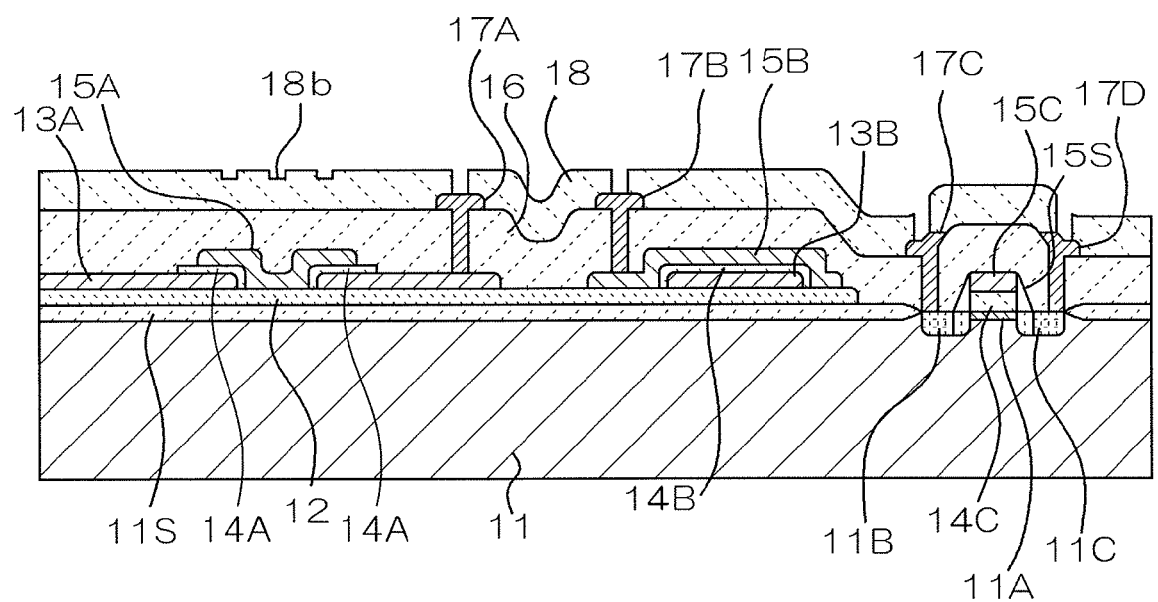
FIG. 7

FUNCTIONAL DEVICE WITH FUNCTIONAL STRUCTURE OF A MICROELECTROMECHANICAL SYSTEM DISPOSED IN A CAVITY OF A SUBSTRATE, AND MANUFACTURING METHOD THEREOF

BACKGROUND

1. Technical Field

The present invention relates to a functional device and a manufacturing method thereof, and particularly, to a functional device in which a functional structure of an MEMS (microelectromechanical system) or the like is disposed in a cavity configured in a substrate, and a manufacturing method thereof.

2. Related Art

In general, an MEMS (microelectromechanical system) acting as a functional device is manufactured as various electronic parts utilizing a micropatterning technology used in a semiconductor manufacturing process or the like. In many cases, at least one portion of MEMS structures is contained and disposed inside a cavity configured in a substrate, and the cavity is hermetically sealed from above by a cover when necessary, and put into a condition in which it is depressurized and sealed, or a condition in which a specialty gas is sealed in it.

For example, in JP-A-2004-314292, a sealing structure is described which is configured by a method of, after forming an MEMS structure together with a sacrifice layer, and forming an insulating layer on the MEMS structure, forming a first sealing layer, which includes a vent, on the insulating layer, etching away the insulating layer and the sacrifice layer through the vent, forming a cavity and, after introducing a gas into the cavity, by forming a second sealing layer on the first sealing layer, closing the vent.

Also, in JP-A-2006-263902, a method similar to the heretofore described one is described whereby, in a structure in which a semiconductor integrated circuit device (CMOS) and an MEMS structure are monolithically configured, a cavity is formed at the same time, using a MOSFET wiring formation technology.

However, in the structure in which the cavity is hermetically sealed with the MEMS structure disposed therein in the way heretofore described, for example, in a case in which a first cover layer including apertures is formed, and a cavity is formed by an etching through the apertures, when the cavity is washed with water after the etching, and subsequently dried, the first cover layer may become depressed inward along with a lowering of a water level in the cavity. Also, in a case in which a second cover layer is subsequently laminated onto the first cover layer, and the cavity is depressurized and sealed, a cover may be depressed inward by an external pressure due to a pressure difference between inside and outside. This kind of depression of the cover, in some cases, causing a poor operation due to the cover making contact with the MEMS structure, or the like, may result in a reduction in an electronic device manufacturing yield, or a reduction in a product quality.

Furthermore, as an aspect of the cover covering the cavity also varies depending on a difference in thermal expansion caused by a layer structure of the cover, a change in manufacturing conditions, or the like, a deformation, such as the inward depression or an outward protrusion, may be caused not only at the heretofore described drying time, and depressurization and sealing time, but by another factor such as an internal stress of a laminate structure, and this may affect the product quality, such as by causing a variation in device characteristics.

SUMMARY

An advantage of some aspects of the invention is to, in a functional device including a cavity containing a functional structure, by reducing a deformation of a cover covering the cavity, reduce a problem such as a poor operation or a variation in device characteristics.

A functional device according to an aspect of the invention includes a substrate; a functional structure formed on the substrate; a cavity in which the functional structure is disposed; and a cover which covers the cavity. The cover includes a bumpy structure including rib shaped portions, or groove shaped portions, which cross a covering range covering at least the cavity.

According to the aspect of the invention, by the bumpy structure including the rib shaped portions or groove shaped portions which cross the covering range covering at least the cavity being provided in the cover covering the cavity containing the functional structure, a rigidity of the cover against a deformation thereof, such as a depression or a protrusion, is improved, by which means it is possible to reduce a problem such as a poor operation of the functional structure, or a variation in device characteristics.

In one aspect of the invention, the bumpy structure includes a plurality of the rib shaped portions or groove shaped portions collateral to each other. According to the aspect, as it is possible to further improve the rigidity of the cover against the depression or protrusion by the bumpy structure including the plurality of rib shaped portions or groove shaped portions collateral to each other, it is possible to further reduce the problem.

Herein, a case is included in which the bumpy structure is configured in a corrugated plate form in at least the covering range. In this case, by the bumpy structure being formed in the corrugated plate form, as well as it being possible to further increase the rigidity of the cover, by forming a surface of a lower layer configured of an insulating film or the like in a corrugated plate form, and forming the cover in a film form on the surface of the lower layer, it is possible to easily form the cover. Herein, the bumpy structure of the corrugated plate form refers to a structure configured in such a way that rib shaped portions provided on one surface side, and groove shaped portions provided on the other surface side, are formed in a position in which each rib shaped portion and each groove shaped portion corresponds to a mutually corresponding position in plan, and a plurality of sets of rib shaped portion and groove shaped portion are collaterally extended.

Also, a case is included in which the rib shaped portions are formed on an inner surface of the cover facing the cavity. In this case, by concave grooves being formed on the surface of the lower layer which, existing before a release, is configured of the insulating film or the like, and the cover being formed thereon in the film form, it is possible to easily form the cover.

Also, in another aspect of the invention, the cover has a first cover layer, formed on a cavity side, which includes apertures facing the cavity, and a second cover layer, which closes the apertures of the first cover layer, and the bumpy structure is provided on the first cover layer. In the case in which the cover has the first cover layer, formed on the cavity side, which includes the apertures facing the cavity, and the second cover layer, which closes the apertures of the first cover layer, as it is possible to carry out an etching process for forming the cavity, a depressurization, and a gas introduction, through the first cover layer including the apertures, and it is possible, by subsequently forming the second cover layer, closing the apertures, to hermetically seal the cavity, it is possible to easily carry out the hermetical sealing of the cavity. Then, in this case, by the bumpy structure being provided on the first cover layer, as a rigidity of the first cover layer is increased, it is possible to reliably reduce a deformation of the cover, such as the depression or protrusion, at a cavity formation time, a drying time after a washing with water, a depression and sealing time, or the like.

In still another aspect of the invention, the functional structure includes a movable portion, which operates in conjunction with a function thereof, on a cover side, and a range of the inner surface of the cover facing the cavity, which overlaps the movable portion in plan, is made a flat surface region which includes no slopes or steps provided by the rib shaped portions or the groove shaped portions. According to the aspect, by the range of the inner surface of the cover overlapping the movable portion in plan being made the flat region, even in the event that it is not possible to sufficiently secure a space between the movable portion and the cover, it is possible to avoid an occurrence of a problem, such as causing an increase or variation in parasitic capacity, or the movable portion making contact with the bumpy structure of the cover when the movable portion operates. Herein, in order to increase the rigidity of the cover, it is preferable that the bumpy structure is provided on each side of the range overlapping the movable portion in plan.

In a different aspect of the invention, the functional structure includes a movable portion, which operates in conjunction with a function thereof, on a cover side, and the rib shaped portions are formed, avoiding the range overlapping the movable portion in plan, on the inner surface of the cover facing the cavity. According to the aspect, as the rib shaped portions are formed, avoiding the range overlapping the movable portion in plan, on the inner surface of the cover, even in the event that it is not possible to sufficiently secure the space between the movable portion and the cover, it is possible to avoid an occurrence of a problem, such as causing an increase or variation in parasitic capacity, or the movable portion making contact with a rib shaped portion of the cover when the movable portion operates. Herein, in order to increase the rigidity of the cover, it is preferable that the rib shaped portion is provided on each side of the range overlapping the movable portion in plan.

In a still different aspect of the invention, the functional structure includes a movable portion, which operates in conjunction with a function thereof, on a cover side, and the bumpy structure is configured in such a way that the rib shaped portions or the groove shaped portions cross the range overlapping the movable portion in plan. According to the aspect, by the bumpy structure being configured in such a way that the rib shaped portions or the groove shaped portions cross the range overlapping the movable portion in plan, in the event that it is not possible to sufficiently secure the space between the movable portion and the cover, as it is possible to increase a rigidity of the cover in the range, it is possible to further reduce the deformation in the range, by which means it is possible to reduce a problem such as the poor operation of the functional structure, or the variation in device characteristics.

In another aspect of the invention, the apertures are formed in a flat region of the first cover layer, avoiding a bumpy region of the first cover layer provided by the rib shaped portions or the groove shaped portions. According to the aspect, by the apertures being provided in the flat region of the first cover layer, avoiding the bumpy region which, including slopes and steps, is formed by the rib shaped portions or groove shaped portions, as the apertures can be stably formed, it is possible to increase an accuracy and reproducibility of an opening shape and, as it is possible, as a result thereof, to secure a stability of a release step, and the reproducibility, it is possible to achieve a stabilization of characteristics, and an improvement in yield, of the functional structure.

In still another aspect of the invention, the functional structure includes a movable portion, which operates in accordance with a function thereof, on a cover side, and the apertures are formed avoiding the range overlapping the movable portion in plan. According to the aspect, by the apertures being formed avoiding the range overlapping the movable portion in plan, it is possible to prevent a closing material adhering to the movable portion when closing the apertures, causing a problem with the functional structure.

In another aspect of the invention, a plurality of the apertures are disposed dispersed in the cover, and the rib shaped portions or the groove shaped portions are extended in a linear form passing between the apertures. In the invention, an extending form of the rib shaped portions or groove shaped portions is not particularly limited to the linear form. It is also acceptable to use, for example, a meandering form, a zigzag form, or an inflectional form. However, by configuring the rib shaped portions or groove shaped portions in the linear form, it is possible to further increase a rigidity enhancing effect. Also, by providing the plurality of apertures, it is possible to easily carry out the formation, depressurization, gas introduction or the like of the cavity but, as this reduces the rigidity of the cover, by adopting a configuration such that the rib shaped portions or the groove shaped portions are extended in the linear form passing between the apertures, it is possible to reliably secure the rigidity.

In another aspect of the invention, the cavity is depressurized and sealed. The invention, not taking a condition in which the cavity is depressurized and sealed to be an essential requirement, is also effective in a case in which the cavity is not depressurized, in a case in which a gas is sealed in, or the like but, as a pressure difference between inside and outside becomes greater in the case in which the cavity is depressurized and sealed, there is a higher possibility of the poor operation of the functional structure occurring due to the depression of the cover, meaning that the invention is effective particularly in this aspect. Aspects other than the case in which the cavity is depressurized and sealed include a case in which the cavity is hermetically sealed by the cover under ordinary pressure, a case in which the cavity is covered with the cover, but not hermetically sealed, a case in which a gas or the like is pressurized, and sealed in the cavity, and the like.

A method, according to an aspect of the invention, of manufacturing a functional device including a substrate, a functional structure formed on the substrate, a cavity in which the functional structure is disposed, and a cover which covers the cavity, includes: forming the functional structure together with a sacrifice layer; forming an insulating film, which includes a bumpy shape, including groove shaped portions or rib shaped portions, in at least one portion of a surface region, on the functional structure; forming a first cover layer which, by being formed in the surface region, as well as having a bumpy structure, which includes rib shaped portions or groove shaped portions, reflecting the bumpy shape, has apertures; removing the insulating film and sacrifice layer on the functional structure through the apertures of the first cover layer; and forming a second cover layer closing the apertures of the first cover layer.

A method of manufacturing a functional device including a substrate, a functional structure formed on the substrate, a cavity in which the functional structure is disposed, and a cover which covers the cavity, according to another aspect of the invention includes: forming the functional structure together with a sacrifice layer; forming an insulating film on the functional structure; forming a first cover layer which includes an at least two layer laminate structure on the insulating film and, as well as having a bumpy structure including rib shaped portions, or groove shaped portions, which correspond to a formation range of at least one layer, has apertures; removing the insulating film and sacrifice layer on the functional structure through the apertures of the first cover layer; and forming a second cover layer closing the apertures of the first cover layer.

In one aspect of the invention, in the covering step, by the second cover layer being formed in a depressurized space by a vapor growth method, the cavity is depressurized and sealed. By the second cover layer being formed in the depressurized space by the vapor growth method, it is possible to extremely easily depressurize and seal the cavity. However, the invention, not being limited to the case in which the cavity is depressurized and sealed, can also be applied to a case in which the cavity is hermetically sealed by the cover under ordinary pressure, a case in which the cavity is covered with the cover, but not hermetically sealed, a case in which a gas or the like is pressurized, and sealed in the cavity, or the like.

BRIEF DESCRIPTION OF THE DRAWINGS

The invention will be described with reference to the accompanying drawings, wherein like numbers reference like elements.

FIGS. 3A and 3B are a fragmentary plan view and a fragmentary sectional view, respectively, of another structure of the embodiment.

FIGS. 4A and 4B are a fragmentary plan view and a fragmentary sectional view, respectively, of another structure of the embodiment.

FIGS. 5A and 5B are a fragmentary plan view and a fragmentary sectional view, respectively, of another structure of the embodiment.

FIGS. 6A to 6F are diagrammatic sectional views showing other cross-sectional shapes of a cover, or any cover layer, of the embodiment.

FIG. 7 is a diagrammatic process sectional view showing a manufacturing process of the embodiment.

DESCRIPTION OF EXEMPLARY EMBODIMENTS

Figure 1:
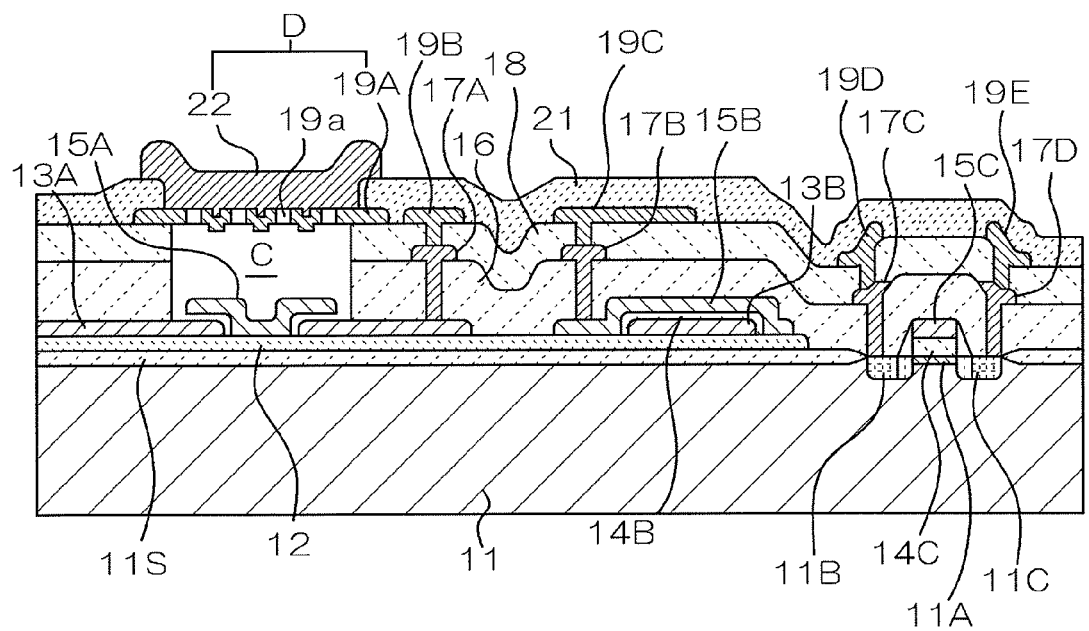
FIG. 1 is a diagrammatic vertical sectional view showing a structure of an embodiment.
Figures 2A, 2B:
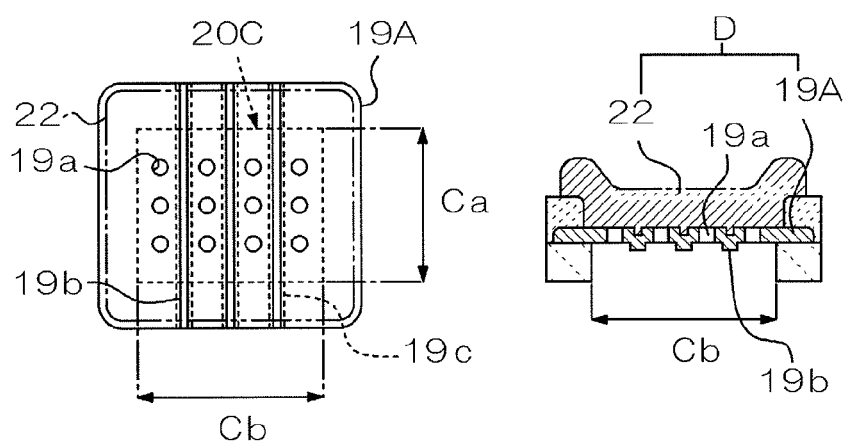
FIGS. 2A and 2B are a fragmentary plan view and a fragmentary sectional view, respectively, of a cavity vicinity of the embodiment.

Next, referring to the accompanying drawings, a detailed description will be given of embodiments of the invention. Firstly, a description will be given of an embodiment of a functional device according to some aspects of the invention. FIGS. 1, 2A and 2B are diagrammatic enlarged vertical sectional views showing an example of a cross-sectional structure of the functional device according to some aspects of the invention.

In the embodiment, a substrate 11 formed of a semiconductor substrate, such as a silicon or compound semiconductor substrate, or the like, is used. However, in the invention, the substrate 11 may also be configured of another material such as glass, ceramics, a sapphire, a diamond, or a synthetic resin.

In the embodiment, an element separation film 11S such as a LOCOS (Local Oxidation of Silicon) film is formed on the substrate 11 by an ordinary method (a thermal oxidation method or the like), on top of which is formed a foundation layer (an element separation layer) 12 configured of silicon nitride or the like. A lower structural portion 13A and an upper structural portion 15A, which configure an MEMS structure such as a resonator, a filter, an actuator, or a sensor, are formed on the foundation layer 12. The lower structural portion 13A and the upper structural portion 15A are disposed facing each other across a space. Also, a capacitor, in which a lower electrode 13B and an upper electrode 15B are disposed facing each other across an insulating film 14B, is also configured on the foundation layer 12. Furthermore, an MOS transistor formed of an active layer 11A, impurity regions 11B and 11C, a gate insulator 14C, and a gate electrode 15C, is formed in a superficial portion of the substrate 11. The MOS transistor, being surrounded by the element separation film 11S in plan, is elementally separated from a surrounding structure.

The lower structural portion 13A and the upper structural portion 15A, although their material is not particularly limited as long as it is a conductor, are desirably configured of, for example, a conductive silicon film (doped polysilicon) on account of it being possible to form each of them by the same process, or the same kind of process, as the gate electrode 15C configuring the MOS transistor. The conductive silicon film, being a material configuring a functional layer formed in a semiconductor manufacturing process, has an advantage in that, by forming it at the same time, not only as the MOS transistor, but as the functional layer in a semiconductor circuit, it is possible to share a manufacturing process.

Interlayer insulating films 16 and 18 which, being insulating layers, are made of silicon oxide ($SiO_2$), more specifically, PSG (phosphosilicate glass), TEOS (a CVD film formed with tetraethoxysilane or the like as a raw material gas), or the like, and wiring layers 17A, 17B, 17C and 17D, as well as a first cover layer 19A and wiring layers 19B, 19C, 19D and 19E, which are made of aluminum or the like, are formed on the substrate 11. The wiring layers are used as a conductive pattern for forming a predetermined circuit on the substrate 11. A surface protection film 21 made of silicon oxide (SiO$_2$), silicon nitride (Si$_3$N$_4$) or the like is laminated on top of the heretofore mentioned layers. The surface protection film 21, as well as the interlayer insulating films and a sacrifice layer to be described hereafter, is configured of a material having a patterning (etching) selectivity. Furthermore, a second cover layer 22 is formed on the first cover layer 19A.

Openings are provided in the interlayer insulating films 16 and 18, and a cavity C, inside which the MEMS structure is disposed, is configured by the openings. The cavity C is hermetically sealed by being covered from above with a cover D configured of the first cover layer 19A and the second cover layer 22. A plurality of apertures 19a communicating with the cavity C are formed in the first cover layer 19A, and the apertures 19a are closed by being covered from above with the second cover layer 22.

The first cover layer 19A is formed at the same time as the wiring layers 19B, 19C, 19D and 19E. For example, by forming a metal layer, and subsequently patterning it, the apertures 19a of the first cover layer 19A are formed at the same time as contour patterns of the first cover layer 19A and each wiring layer. Herein, the first cover layer 19A may be configured of a laminate structure with a plurality of layers in the same way as other wiring layers. For example, a first layer (a bottom layer) is configured of Ti or TiN having a thickness of 1 to 1000 nm, preferably, around 50 nm, a second layer (an intermediate layer) configured of an Al—Cu alloy layer having a thickness of 10 to 10000 nm, preferably, around 800 nm, and a third layer (a top layer) configured of TiN having a thickness of 1 to 1000 nm, preferably, around 50 nm. In this case, by the first layer to be disposed immediately above the cavity C being removed in advance, it is possible to easily carry out a release step.

In practice, the cavity C, which is formed of the openings, is formed by the release step which carries out a process of, after forming the interlayer insulating films 16 and 18, forming the first cover layer 19A, etching away the interlayer insulating films 16 and 18 by means of a wet etching, a dry etching, or the like, through the apertures 19a of the first cover layer 19A, and subsequently cleaning them.

Also, the second cover layer 22 is formed under reduced pressure by a vapor growth method, such as a vacuum deposition, sputtering, or CVD method on the first cover layer 19A, by which means the apertures 19a are closed in a condition in which the cavity C is depressurized through the apertures 19a. The second cover layer 22 is formed of an insulator, such as silicon oxide or silicon nitride, or a metal, such as aluminum, titanium or tungsten. This second cover layer 22 formation step is a cavity C depressurization and sealing step.

FIGS. 2A and 2B are a fragmentary plan view, and a fragmentary sectional view, respectively, of the cavity C vicinity shown in FIG. 1. Herein, in FIG. 2A, the second cover layer 22 shown by the two dot chain line being omitted, a shape of the first cover layer 19A below it is shown by the full line. In the embodiment, rib shaped portions 19b, and groove shaped portions 19c, which cross a covering range 20C (referring to a range in which the cavity C is covered with the cover D. In the illustrated example, it is a Ca vertical×Cb horizontal, rectangular range.), are formed on the first cover layer 19A disposed above the cavity C. A dimension of Ca and Cb indicating the covering range 20C is taken to be normally within 10 to 500 μm, generally, around 20 to 60 μm. Herein, the rib shaped portions 19b are protruded from an inner surface (an internal surface facing the cavity C) of the first cover layer 19A, and extended in a linear form at least from one extremity, to an opposite extremity, of the covering range 20C. Also, the groove shaped portions 19c are formed in an outer surface (an external surface opposite the cavity C) of the first cover layer 19A, and extended in the linear form at least from the one extremity, to the opposite extremity, of the covering range 20C.

Herein, it being sufficient that the rib shaped portions 19b and groove shaped portions 19c all cross the covering range 20C, although it is preferable that they are extended in the linear form in the way heretofore described, it is also acceptable that they are extended in a meandering form, a zigzag form, an inflectional form, or a curved form. Also, it is preferable that they are extended, beyond the covering range 20C, as far as both sides thereof. In the illustrated example, the rib shaped portions 19b and the groove shaped portions 19c are all formed all over from an extreme edge, to an opposite extreme edge, of the first cover layer 19A.

In the case of the embodiment, the plurality of apertures 19a are disposed dispersed in the first cover layer 19A, and the rib shaped portions 19b and the groove shaped portions 19c are formed in such a way as to pass between the apertures 19a. Also, in the embodiment, pluralities of the rib shaped portions 19b and groove shaped portions 19c are extended collateral to each other (in the illustrated example, in parallel). Then, the first cover layer 19A is configured in a corrugated plate form as a whole. By this means, a rigidity of the first cover layer 19A being increased, in particular, it is possible to prevent the cover D from being deformed in an aspect such as being depressed or protruded. In particular, as the first cover layer 19A has a low rigidity due to the plurality of apertures 19a being formed dispersed therein, the rib shaped portions 19b and groove shaped portions 19c provided in an aspect in which they cross the covering range 20C, as heretofore described, are extremely effective.

Although, in some cases, a rib refers generally to an integrated reinforcing material which, being formed on a surface, is attached in a direction perpendicular to the surface, the rib shaped portion used in the present specification shall broadly include, not only the rib itself, but an aspect of having a thick portion protruded in a rib shape from a surface, but is not limited to one protruded in a direction perpendicular to the surface.

FIGS. 3A and 3B are a fragmentary plan view, and a fragmentary sectional view, respectively, showing an aspect differing from the heretofore described embodiment. In this example, rib shaped portions 19d are formed on the outer surface of the first cover layer 19A. The rib shaped portions 19d are the same as the heretofore described rib shaped portions 19c in that they cross the covering range 20C, and are extended in the linear form passing between the apertures 19a, and a plurality of them are provided collateral to each other. However, they are different in that, as the opposite, inner surface of the first cover layer 19A is configured so as to be flat, and the heretofore described groove shaped portions are not formed, a whole shape is not configured in the corrugated plate form. The example is the same as the heretofore described embodiment in that the rigidity of the first cover layer 19A is improved even with this kind of shape.

FIGS. 4A and 4B are a fragmentary plan view, and a fragmentary sectional view, respectively, showing an aspect further differing from the heretofore described embodiment. This example is different from the heretofore described embodiment in that rib shaped portions 19e and rib shaped portions 19f, which intersect each other, are provided on the first cover layer 19A. A plurality of the rib shaped portions 19e, as well as a plurality of the rib shaped portions 19f, are provided on the first cover layer 19A in an aspect in which they are collateral to each other. In the illustrated example, both pluralities of rib shaped portions 19e and 19f are provided on the outer surface of the first cover layer 19A, but it is also acceptable that both pluralities are provided on the inner surface, or it is also acceptable that one plurality is provided on the outer surface, and the other on the inner surface.

FIGS. 5A and 5B are a fragmentary plan view, and a fragmentary sectional view, respectively, showing another aspect differing from the heretofore described embodiment. In this example, rib shaped portions 22b are formed on an outer surface of the second cover layer 22. In this case, it is impossible to suppress, for example, a deformation before the second cover layer 22 formation but, as a rigidity of the cover D is improved after the formation of the second cover layer 22 by forming the rib shaped portions 22b by means of a film formation method using a slit or mask in the second cover layer 22 formation step, it is possible to suppress, for example, a deformation caused by a pressure difference between inside and outside after the depressurization and sealing. In the illustrated example, the rib shaped portions 22b are provided, but it is also possible, in place of them, to provide groove shaped portions on the outer surface of the second cover layer 22.

FIGS. 6A to 6F are diagrammatic sectional views showing various kinds of aspect in a case in which a cover D is provided with rib shaped portions or groove shaped portions. FIG. 6A shows one having a literally corrugated form in cross-section, FIG. 6B one having square concavities and convexities in cross-section, FIG. 6C one having triangular concavities and convexities in cross-section, FIG. 6D one having rib shaped portions on an upper surface, FIG. 6E one having groove shaped portions on the upper surface, and FIG. 6F one having rib shaped portions on a lower surface. In each case, it is possible to improve a flexural rigidity of the cover D. Each illustrated example, showing an example of a schematic shape of a bumpy structure, depicts a degree of concavity and convexity emphatically but, in practice, it is preferable that a difference in bumpy elevation between front and back sides is less than a film thickness. This is because, in the event that the difference in bumpy elevation is greater than the film thickness, the rigidity is further reduced due to a cohesive condition or the like at a film formation time. In the invention, the corrugated plate like bumpy structure refers to a structure configured in such a way that rib shaped portions provided on one surface side, and groove shaped portions provided on the other surface side, are formed in a position in which each rib shaped portion and each groove shaped portion corresponds to a mutually corresponding position in plan, and a plurality of sets of rib shaped portion and groove shaped portion are collaterally extended, in the way heretofore described, but to use the heretofore described specific example, it corresponds to the cross-sectional shapes of FIGS. 6A, 6B and 6C.

Next, referring to FIGS. 7 to 9, a description will be given of a functional device manufacturing method of some aspects of the invention. The manufacturing method to be described hereafter shows an example of a case of manufacturing a compound device in which are integrated an MEMS element, which has the MEMS structure, and a semiconductor circuit, which has semiconductor elements, but the invention, not being limited to this kind of aspect, incorporates each kind of functional device configured with a functional structure disposed in the cavity.

As shown in FIG. 7, firstly, the active layer 11A is formed in the superficial portion of the substrate 11. The foundation layer 12 is formed on the substrate 11 by a film formation technology, such as a sputtering method or a CVD method, and a micropatterning technology, and the lower structural portion 13A and the lower electrode 13B are simultaneously formed on the foundation layer 12, using the same material, by a film formation technology, such as a sputtering method or a CVD method, and a micropatterning technology.

Next, the sacrifice layer 14A, the insulating film 14B and the gate insulator 14C are simultaneously formed using the same material by a sputtering method or a CVD method. Subsequently, the upper structural portion 15A, the upper electrode 15B and the gate electrode 15C are simultaneously formed using the same material by a sputtering method, a CVD method, or the like. After the formation of the gate electrode 15C, the impurity regions 11B and 11C are formed using a self-alignment, with the gate electrode 15C as a mask, by ion implantation or the like.

Next, the interlayer insulating film 16 is formed on the heretofore described structure by a sputtering method, a CVD method, or the like, and contact holes are formed by a patterning. Subsequently, an appropriate wiring pattern is formed on the interlayer insulating film 16 by a vapor deposition method, a sputtering method, a CVD method, or the like, and the wiring layer 17A conductively connected to the lower structural portion 13A, the wiring layer 17B conductively connected to the upper electrode 15B, the wiring layers 17C and 17D conductively connected to the impurity regions 11B and 11C, and the like, are formed through the contact holes. A structure of wirings led out from the MEMS structure, the capacitor, and the MOS transistor, is formed by these wiring layers, including other, unshown wiring layers.

Next, the interlayer insulating film 18 is formed on the heretofore described structure by a sputtering method, a CVD method, or the like. Then, a surface bumpy structure having groove shaped portions 18b in a position above the upper structural portion 15A, as well as contact holes the same as heretofore described, is formed in the interlayer insulating film 18 by a micropatterning technology. It is not impossible to form the surface bumpy structure at the same time as the interlayer insulating film 18 patterning step, either. However, it is desirable that it is formed in another step before or after the patterning step. This is because, by so doing, it is possible to obtain a most suitable bumpy shape by means of a unique process.

Figure 8:
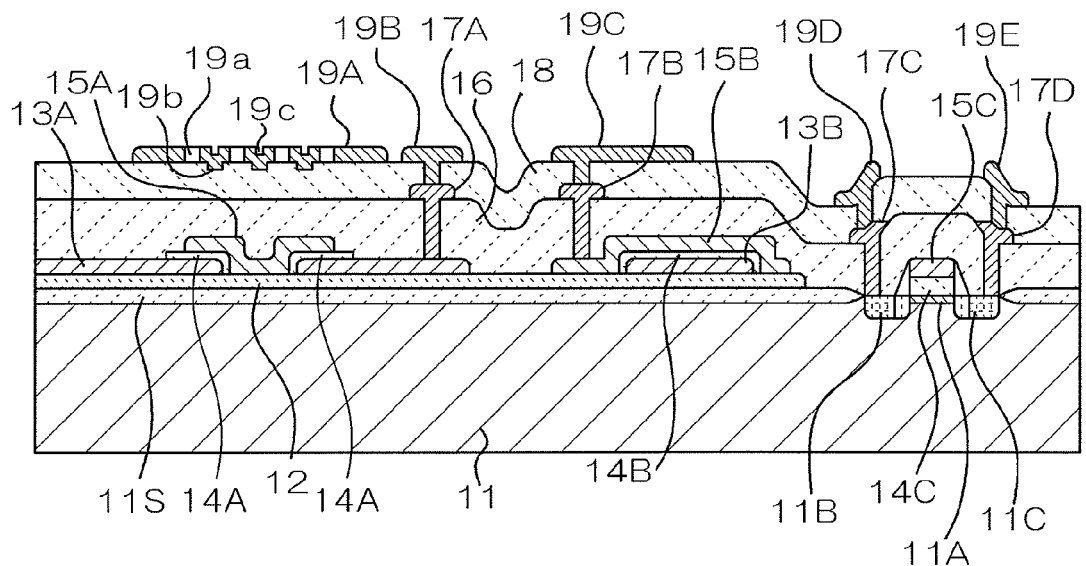
FIG. 8 is a diagrammatic process sectional view showing the manufacturing process of the embodiment.

Next, as shown in FIG. 8, the first cover layer 19A and the wiring layers 19B, 19C, 19D and 19E are formed on the interlayer insulating film 18 by a vapor deposition method, a sputtering method, a CVD method, or the like. In the first cover layer 19A, together with a contour pattern and wiring pattern thereof, the apertures 19a are formed by a micropatterning technology. The first cover layer 19A is formed on the surface bumpy structure, by which means, as well as the rib shaped portions 19b reflecting the groove shaped portions 18b being provided protruded from a lower surface, the groove shaped portions 19c are provided concaved in an upper surface opposite the rib shaped portions 19b. It is also acceptable to adopt a configuration such that rib shaped portions, in place of the groove shaped portions 18b, are provided on a surface of the interlayer insulating film 18, and groove shaped portions reflecting the rib shaped portions are formed on the lower surface (inner surface) of the first cover layer 19A.

Figure 9:
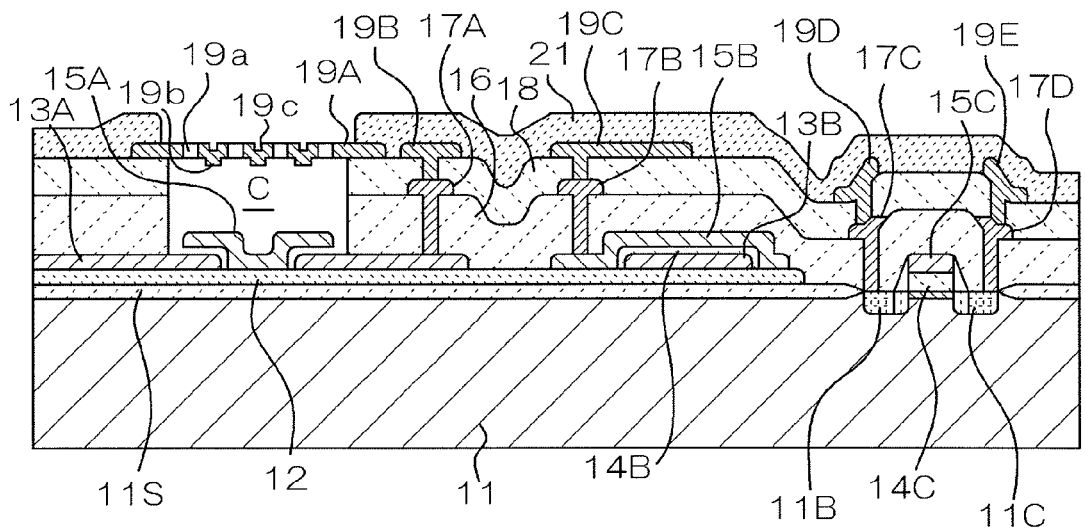
FIG. 9 is a diagrammatic process sectional view showing the manufacturing process of the embodiment.

Subsequently, as shown in FIG. 9, the surface protection film 21 made of silicon nitride or the like is formed on the top surface by a sputtering method, a CVD method or the like. Then, in a condition in which a region except a peripheral edge of the first cover layer 19A is exposed, a region other than the region is completely covered with the surface protection film 21. Then, the interlayer insulating films 18 and 16 and sacrifice layer 14A therebelow are removed through the apertures 19a using a hydrofluoric acid aqueous solution, a buffered hydrofluoric acid aqueous solution, a hydrofluoric acid gas, or the like. By this means, the cavity C is formed. Subsequently, an inner surface of the cavity C is cleaned by washing with water or the like.

Finally, as shown in FIG. 1, in a depressurized space (a reaction chamber), the second cover layer 22 is formed by a vapor deposition method, a sputtering method, a CVD method, or the like, by which means the cavity C is sealed by closing the apertures 19a in the condition in which the cavity C is depressurized.

In the heretofore described embodiment, an example has been shown in which the surface bumpy structure is provided on the interlayer insulating film 18, and the first cover layer 19A is formed thereon in the aspect of, reflecting the surface bumpy structure, having the rib shaped portions 19b and the groove shaped portions 19c, but it is also acceptable that each heretofore described kind of rib shaped portion or groove shaped portion is formed by, for example, forming one of two upper and lower layers in a beam shape, forming the other layer in a plane shape, and laminating them together. Also, it is also acceptable that each heretofore described kind of rib shaped portion or groove shaped portion is formed by forming a film by means of a mask or a slit.

Next, in order to describe a working effect of some aspects of the invention, referring to FIGS. 10 to 12, a description will be given of a comparison example. In the comparison example, the same portions as those of the heretofore described embodiment being identified by identical reference numbers and characters, a description thereof will be omitted.

Figure 10:
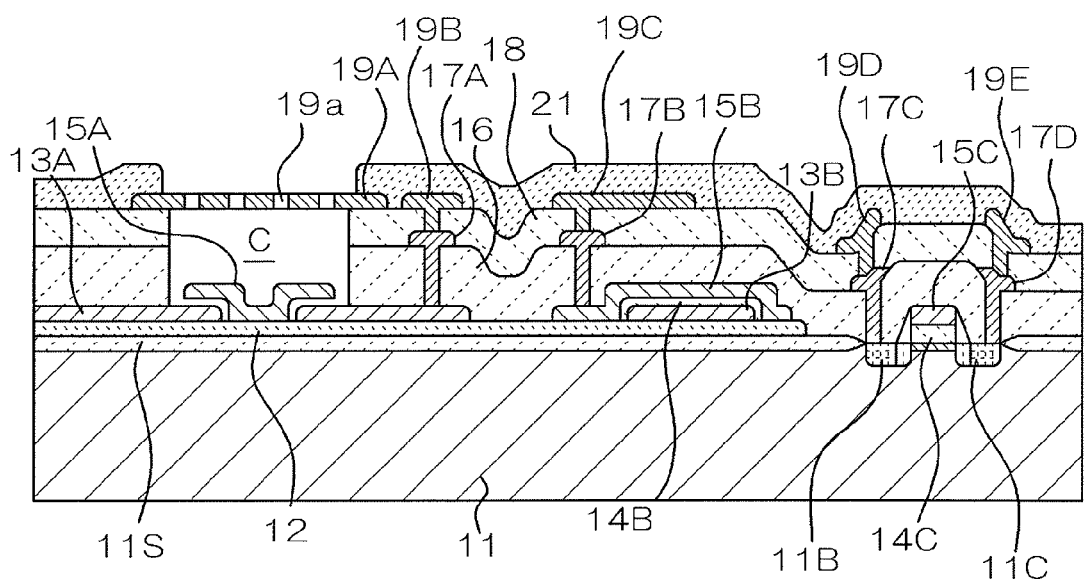
FIG. 10 is a diagrammatic process sectional view showing a comparison example.
Figure 11:
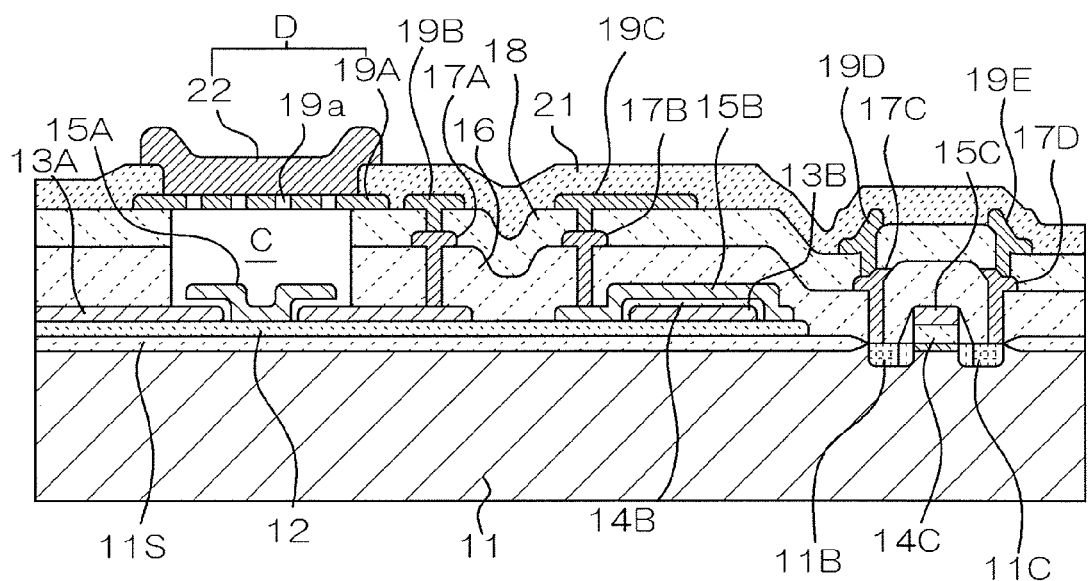
FIG. 11 is a diagrammatic process sectional view showing the comparison example.

In the comparison example, as shown in FIG. 10, it is different from the heretofore described embodiment in that the first cover layer 19A is formed so as to be flat, except for the apertures 19a having a penetrating structure. Then, after the cavity C has been formed in the same way as heretofore described, as shown in FIG. 11, the second cover layer 22 is formed, and the cavity C is depressurized and sealed. In this condition, on a surrounding pressure being returned to the atmospheric pressure, as shown in FIG. 12, the cover D formed of the first cover layer 19A and second cover layer 22 is depressed inward due to the pressure difference between inside and outside the cavity C.

Figure 12:
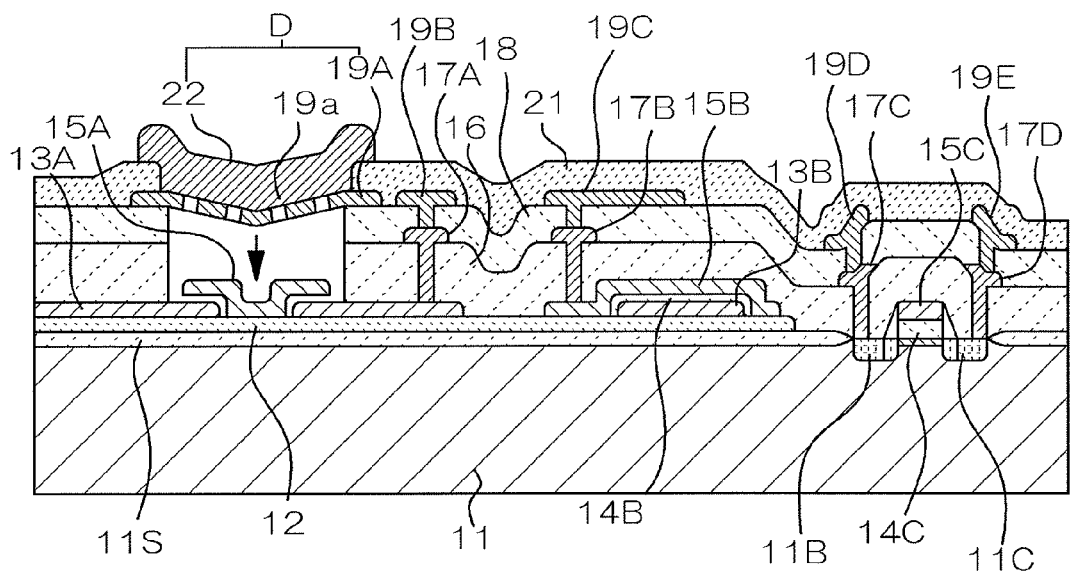
FIG. 12 is a diagrammatic process sectional view showing the comparison example.

As the inward depression of the cover D moves on toward the upper structural portion 15A, as shown by the arrow in FIG. 12, in the worst case, the cover D (the first cover layer 19A) may make contact with the upper structural portion 15A in the cavity C, causing a poor operation of the MEMS structure. Also, even in the event that the contact with the upper structural portion 15A does not occur, the pressure in the cavity C rising, or an electrical field distribution in the cavity C fluctuating, a variation may also occur in characteristics of the MEMS structure. Furthermore, as a deformation may also occur in the cover D due to a composition and film formation conditions of the first cover layer 19A and second cover layer 22, a surface tension of water at a drying time, an internal stress based on a laminate structure of the cover, or the like, apart from the pressure difference between inside and outside, a variation occurs in the deformation of the cover D, due to which it is also conceivable that a variation occurs in device characteristics. In the embodiment, as the deformation of the cover D becomes unlikely to occur by the rigidity being improved as heretofore described, it is possible to reduce the poor operation and the variation in characteristics, and achieve an improvement in a product yield and quality.

An electronic device and its manufacturing method of some aspects of the invention not being limited only to the heretofore described illustrated examples, it is needless to say that it is possible to add various modifications without departing from the scope of the invention.

For example, in the heretofore described embodiment, the MEMS structure configuring the MEMS element as a functional element, such as an actuator, a resonator, a high frequency filter, or the like, is formed on a semiconductor substrate while a semiconductor manufacturing process similar to a CMOS process is being implemented, but the invention, not being limited to the one provided with the MEMS element, can be applied to one provided with various kinds of functional element, other than the MEMS element, such as a crystal oscillator, an SAW element, an acceleration sensor, a gyro sensor, and the like.

Also, in the heretofore described embodiment, a semiconductor device is configured in which the functional element is integrated with a semiconductor integrated circuit, but it is also acceptable to use a substrate other than the semiconductor substrate, or it is also acceptable to use one in which another electronic circuit other than the semiconductor circuit is connected to the functional element.

Figure 13:
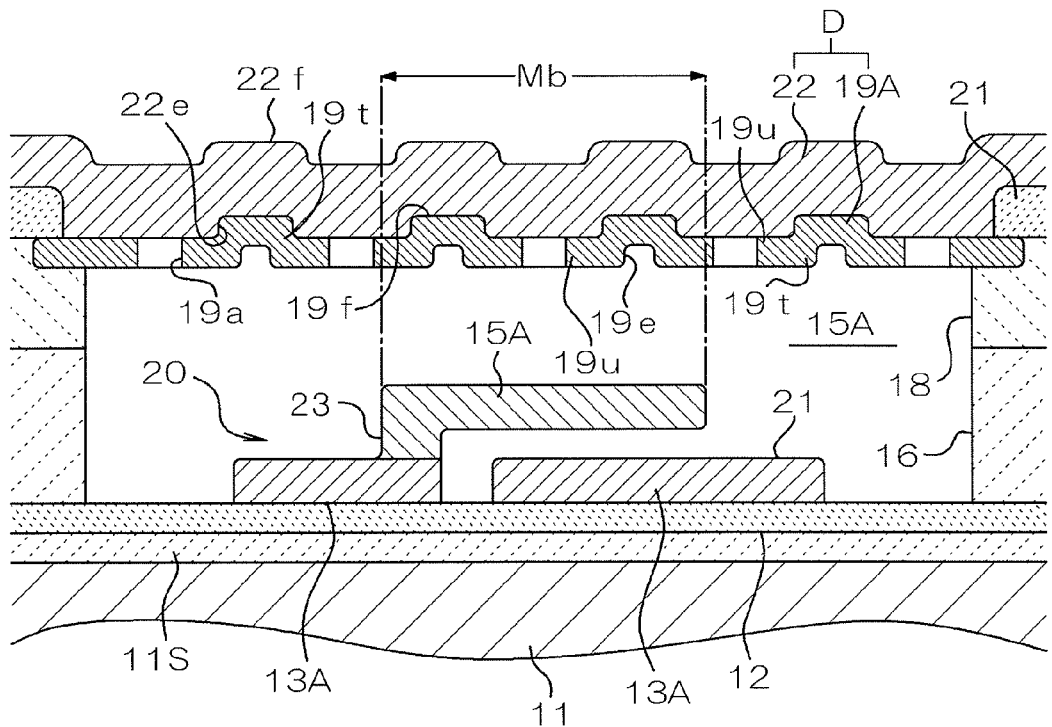
FIG. 13 is an enlarged fragmentary vertical sectional view showing a cavity vicinity of another embodiment.
Figure 14:
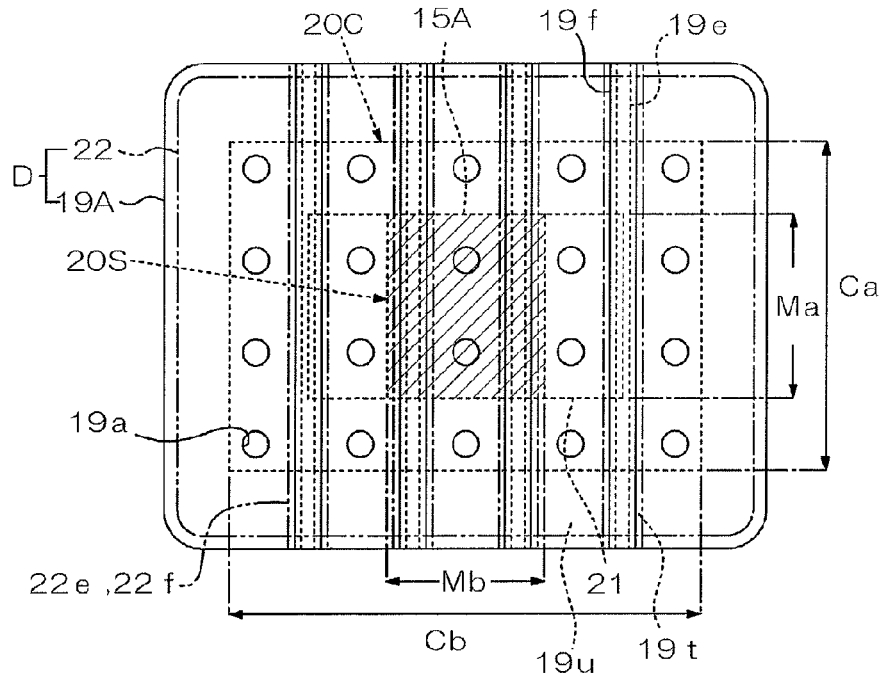
FIG. 14 is an enlarged fragmentary plan view showing a cavity vicinity of another embodiment.

Next, referring to FIGS. 13 and 14, a description will be given of another embodiment according to the invention. FIG. 13 is an enlarged fragmentary sectional view showing in enlarged dimension the vicinity of the cavity C in the embodiment, and FIG. 14 is a plan view of the vicinity of the cavity C in the embodiment. In the embodiment, taking it that structures of unshown portions and undescribed portions can be configured in the same way as in the heretofore described embodiment shown in FIGS. 1 to 12, portions corresponding to those of the relevant embodiment are indicated by identical reference numbers and characters.

In the embodiment, an MEMS structure 20 having a lower structural portion 13A, and an upper structural portion 15A formed on the lower structural portion 13A, one portion of which is disposed above the lower structural portion 13A across a space, are provided in a cavity C. Although the MEMS structure 20 is a functional structure configuring an MEMS, the functional structure is not limited to the MEMS. A movable portion operating in conjunction with a function of the MEMS structure 20 is provided on the upper structural portion 15A. The movable portion is provided on a cover D side in the MEMS structure 20.

In the illustrated example, the lower structural portion 13A being formed in a pattern in which it is divided into two, one portion of the lower structural portion 13A configures a lower electrode 21, and the other portion configures a lower layer portion of an upper electrode 23. Then, the upper structural portion 15A configures the movable portion of the upper electrode 23. The invention not being limited to the case in which the upper structural portion 15A itself configures the movable portion, as shown in the figures, it is also acceptable that one portion of the upper structural portion 15A is the movable portion, it is also acceptable that the movable portion is configured by including a portion other than the upper structural portion 15A, or it is also acceptable that a portion on the cover D side other than the upper structural portion 15A configures the movable portion. In the present specification, the movable portion will be referred to as a movable portion 15A in the following description.

The movable portion 15A being configured in such a way as to overlap the lower electrode 21 in plan, the movable portion and the lower electrode 21 are disposed facing each other across the space. Then, by applying an alternating current signal between the lower electrode 21 and the upper electrode 23, an alternating electrostatic force occurs between the lower electrode 21 and the upper electrode 23, and the movable portion 15A of the upper electrode 23 is vibrated by the electrostatic force. Consequently, the MEMS structure 20 functions as a resonator or a filter depending on a vibration characteristic of the movable portion 15A of the upper electrode 23.

The functional structure (MEMS structure 20) not being limited to the heretofore described configuration, for example, it is also acceptable that, as in a static actuator or the like, the movable portion 15A is provided directly on a foundation layer 12 without a space in between, and also, it is also acceptable that, as in a pressure sensor or the like, by one portion of a structural portion being reduced in wall thickness, the portion reduced in wall thickness is configured as the movable portion 15A.

The cavity C is covered from above with the cover D configured of a first cover layer 19A and a second cover layer 22. In the same way as in each previous embodiment, the first cover layer 19A is supported in a height position spaced from the foundation layer 12 and the MEMS structure 20 by insulating films 16 and 18 formed on a substrate 11, and configured in a flat plate form as a whole. Groove shaped portions 19e are formed on an inner surface of the first cover layer 19A facing the cavity C. The groove shaped portions 19e cross the cavity C, as shown in FIG. 14. Rib shaped portions 19f corresponding to the groove shaped portions 19e are formed on an outer surface of the first cover layer 19A. Also, groove shaped portions 22e corresponding to the rib shaped portions 19f are formed on an inner surface of the second cover layer 22, and rib shaped portions 22f corresponding to the groove shaped portions 22e are formed on an outer surface of the second cover layer 22. In the embodiment, pluralities of the groove shaped portions 19e, rib shaped portions 19f, groove shaped portions 22e and rib shaped portions 22f are each collaterally formed in a linear form in such a way as to cross a covering range 20C. Then, the first cover layer 19A of the cover D configured in this way is provided with bumpy regions 19t (each of which has a sloped surface and a stepped surface on at least one of an inner surface or an outer surface), which have slopes and steps formed by the groove shaped portions 19e, rib shaped portions 19f, groove shaped portions 22e and rib shaped portions 22f, and flat regions (regions in each of which both the inner surface and the outer surface are flat, that is, regions having no bumpy structure) 19u between adjacent pluralities of groove shaped portions 19e, rib shaped portions 19f, groove shaped portions 22e and rib shaped portions 22f, as well as between these regions and outer edges of the covering range 20C. The flat regions 19u are provided with a width wider than a width of the groove shaped portions 19e, rib shaped portions 19f, groove shaped portions 22e and rib shaped portions 22f.

In the same way as in the previously described embodiment, apertures 19a are provided in the first cover layer 19A. The apertures 19a are formed in such a way as to face the cavity C, and a plurality of the apertures 19a are disposed dispersed within the covering range 20C. In the case of the illustrated example, the apertures 19a are formed, avoiding the bumpy regions 19t, in the flat regions 19u provided between adjacent ones. By providing the apertures 19a in the flat regions 19u in this way, as it is possible to form an opening shape with a high accuracy and a good reproducibility without losing a shape of the apertures 19a, and it is also possible to secure a etchant circulation property at a release time, as will be described in detail hereafter, a stability at a manufacturing time is also improved and, it being possible to secure a stability and reproducibility of the characteristics of the MEMS structure 20, it is also possible to improve the yield.

In the embodiment, a range of the MEMS structure 20 overlapping with the movable portion 15A in plan (hereafter referred to simply as a "movable plane range 20S") is provided within the covering range 20C. Herein, the movable portion 15A is configured in a rectangular shape in a plan view, as a result of which the movable plane range 20S is also made an Ma vertical×Mb horizontal, rectangular range. However, the shape of the movable plane range 20S not being limited to the rectangular shape, it is acceptable that it, as well as the shape of the movable portion 15A, has another optional planar shape, such as a polygonal shape, a circular shape, an oval shape, an elliptical shape, or the like.

In the embodiment, the groove shaped portions 19e, rib shaped portions 19f, groove shaped portions 22e and rib shaped portions 22f are provided in such a way as to cross the movable plane range 20S. By this means, as it is possible to increase the rigidity of the cover D immediately above the movable portion 15A of the MEMS structure 20, it is possible to prevent a problem with the MEMS structure 20 caused by the deformation of the cover D, for example, an increase or variation in parasitic capacity, or a contact of the movable portion 15A with the first cover layer 19A.

In the illustrated example, the apertures 19a are also formed in the movable plane range 20S overlapping the movable portion 15A in plan but, when forming the second cover layer 22, and closing the apertures 19a, in order to prevent a constituent material of the second cover layer 22 from adhering to the movable portion 15A through the apertures 19a, the characteristics of the MEMS structure 20 from differing from a design value, or the variation in the characteristics from being increased, it is preferable not to provide the apertures 19a in the movable plane range 20S.

Also, in the embodiment, it being preferable that at least one of the first cover layer 19A or the second cover layer 22 is configured of a conductor such as a metal, it is more preferable that both layers are configured of a conductor. This is because, by configuring the cover D of a conductor such as a metal, it is possible to obtain an electromagnetic blocking action. In this case, it is desirable that the cover D is electrically grounded.

Figure 17:
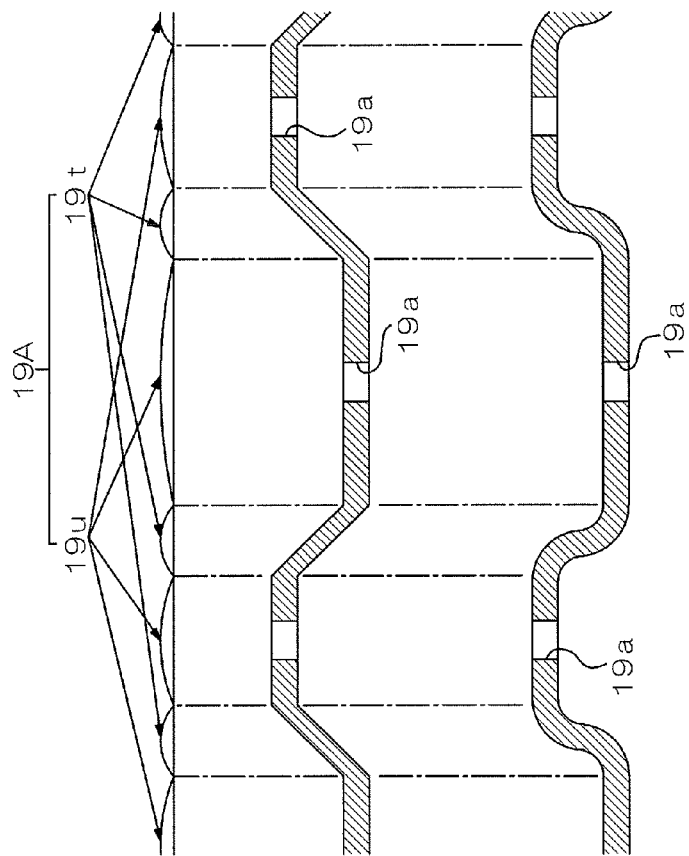
FIG. 17 is a schematic diagrammatic plan view for illustrating a positional relationship between a bumpy structure and apertures of the cover.

FIG. 17 is a sectional view schematically showing a relationship between the bumpy structure of the first cover layer 19A and the apertures 19a, for illustrating a formation position of the apertures 19a in the heretofore described embodiment. As shown in (a) of FIG. 17, the apertures 19a are not formed in the bumpy regions 19t of the first cover layer 19A (in the illustrated example, they are formed of only sloped portions, but it is also acceptable that they are configured of stepped portions), and the apertures 19a are formed only in the flat regions 19u of the first cover layer 19A. The bumpy regions 19t of the first cover layer 19A shown in FIG. 17, differing from bumpy surface regions 19z on the heretofore described inner surface shown in FIG. 18, to be described hereafter, refer to portions of the first cover layer 19A provided with the slopes and steps on at least one of the inner surface or the outer surface. Also, the flat regions 19u of the first cover layer 19A refer to portions of the first cover layer 19A in which both the inner surface and the outer surface are flat.

By forming the apertures 19a in the flat regions 19u of the first cover layer 19A in the way heretofore described, it is possible to achieve an increase in accuracy, and an improvement in reproducibility, of the opening shape of the apertures 19a without losing the opening shape of the apertures 19a formed using, for example, a photolithographic technology. Consequently, it is possible to stabilize the release step, and thereby increase a reproducibility of the shape of the cavity C, as a result of which it is possible to achieve a stabilization of the characteristics of the MEMS structure 20, and the improvement in the yield. As opposed to this, in the event that the apertures 19*a* are provided in the bumpy regions 19*t*, as at least one of the inner surface or outer surface of the first cover layer 19A is sloped or stepped, for example, a deficient or excessive exposure occurring at a photolithography time, an etching mask becomes defective, as a result of which there is a risk of the apertures 19*a* not being formed, or the opening shape becoming too small or too large.

Figure 15:
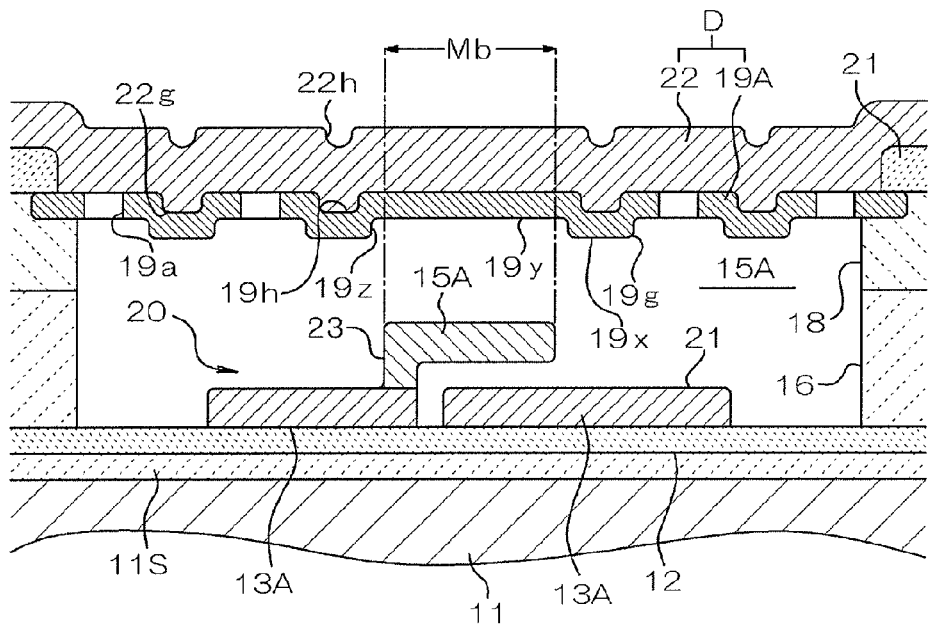
FIG. 15 is an enlarged fragmentary vertical sectional view showing a cavity vicinity of still another embodiment.
Figure 16:
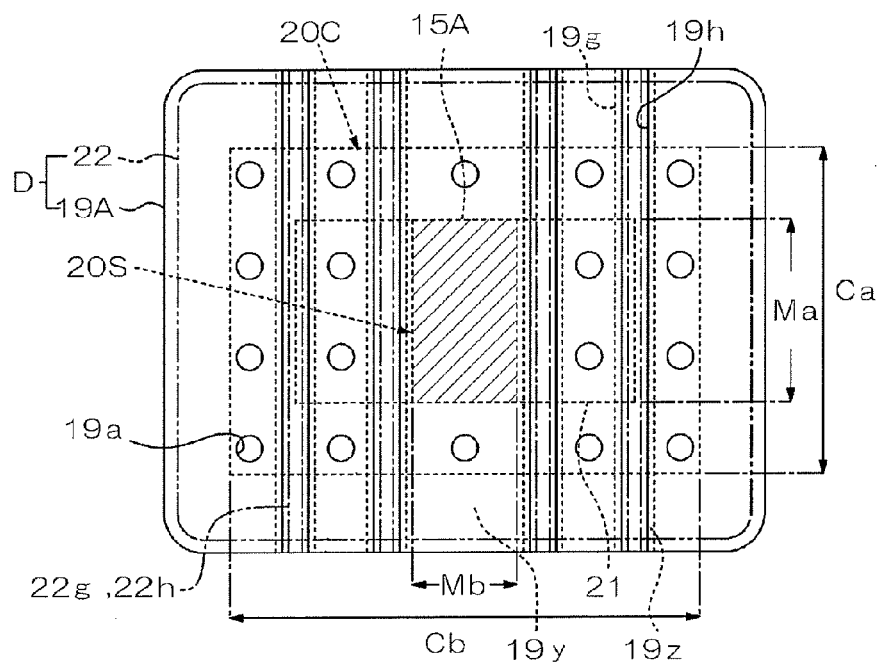
FIG. 16 is an enlarged fragmentary plan view showing a cavity vicinity of still another embodiment.

Next, referring to FIGS. 15 and 16, a description will be given of still another embodiment according to the invention. FIG. 15 is an enlarged fragmentary sectional view showing in enlarged dimension a vicinity of a cavity C in the embodiment, and FIG. 16 is a plan view of the vicinity of the cavity C of the embodiment. In the embodiment, taking it that structures of unshown portions and undescribed portions can be configured in the same way as in the heretofore described embodiment shown in FIGS. 1 to 12, portions corresponding to those of the relevant embodiment are indicated by identical reference numbers and characters. Also, among items not to be described hereafter, items which, having been described in the embodiment described referring to FIGS. 13, 14 and 17, do not conflict with the present embodiment, are configured in the same way as heretofore described, in the present embodiment too.

In the embodiment, an MEMS structure 20 is the same as that of the embodiment shown in FIGS. 13 and 14, but a bumpy structure provided on a first cover layer 19A and a second cover layer 22 is different. In the embodiment, the first cover layer 19A has rib shaped portions 19*g* on an inner surface 19*x* facing the cavity C. The rib shaped portions 19*g* cross the cavity C, as shown in FIG. 16. Groove shaped portions 19*h* corresponding to the rib shaped portions 19*g* are formed on an outer surface of the first cover layer 19A. Also, rib shaped portions 22*g* corresponding to the groove shaped portions 19*h* are formed on an inner surface of the second cover layer 22, and groove shaped portions 22*h* corresponding to the rib shaped portions 22*g* are formed on an outer surface of the second cover layer 22. In the embodiment too, pluralities of the rib shaped portion 19*g*, groove shaped portions 19*h*, rib shaped portions 22*g* and groove shaped portions 22*h* are each collaterally formed in a linear form in such a way as to cross a covering range 20C. Then, a cover D configured in this way is provided with flat regions (regions in each of which both an inner surface and an outer surface are flat, that is, regions having no bumpy structure) between adjacent pluralities of rib shaped portions 19*g*, groove shaped portions 19*h*, rib shaped portions 22*g* and groove shaped portions 22*h*, as well as between these regions and outer edges of the covering range 20C. The flat regions have a width wider than a width of the rib shaped portions 19*g*, groove shaped portions 19*h*, rib shaped portions 22*g* and groove shaped portions 22*h*.

In the cover D of the embodiment, the rib shaped portions 19*g* are provided avoiding a movable plane range 20S overlapping a movable portion 15A of an upper electrode 23 of the MEMS structure 20 in plan, and the movable plane range 20S on the inner surface 19*x* of the first cover layer 19A, which is an inner surface of the cover D facing the cavity C, is made a flat surface region 19*y* which, having no slope or step, is formed together with the bumpy structure. By this means, it is possible to secure a space between the movable portion 15A and the cover D with a high accuracy and a good reproducibility, as a result of which it is possible to suppress an occurrence of a problem, such as an increase or variation in parasitic capacity, a contact of the movable portion 15A with the cover D, or the like. Also, as the bumpy structure formed of the rib shaped portions 19*g*, groove shaped portions 19*h*, rib shaped portions 22*g* and groove shaped portions 22*h* is provided in the region avoiding the movable plane range 20S of the cover D, it is possible, by this means, to impart a sufficient rigidity to the cover D. In particular, by the bumpy structure formed of the rib shaped portions 19*g*, groove shaped portions 19*h*, rib shaped portions 22*g*, and groove shaped portions 22*h*, being provided on either side of each heretofore described flat region (the flat surface region 19*y* on the inner surface 19*x* of the first cover layer 19A), it is possible to further increase the rigidity of the cover D.

In the embodiment, no apertures 19*a* being provided in the movable plane range 20S, a plurality of the apertures 19*a* are provided avoiding the movable plane range 20S, and formed dispersed in positions other than the movable plane range 20S within the covering range 20C. By this means, when the apertures 19*a* of the first cover layer 19A are closed by the second cover layer 22, it is possible to prevent the characteristics of the MEMS structure 20 from deteriorating, or the variation in the characteristics from occurring, due to a constituent material of the second cover layer 22 adhering to the movable portion 15A.

In the embodiment, a whole of the cover D within the movable plane region 20S is made the flat region provided with no bumpy structure, but it is sufficient that, on at least the inner surface facing the cavity C, that is, in the embodiment, on the inner surface 19*x* of the first cover layer 19A, the movable plane range 20S is made the flat surface region 19*y* which, having no slope or step, is formed together with the bumpy structure.

Figure 18:
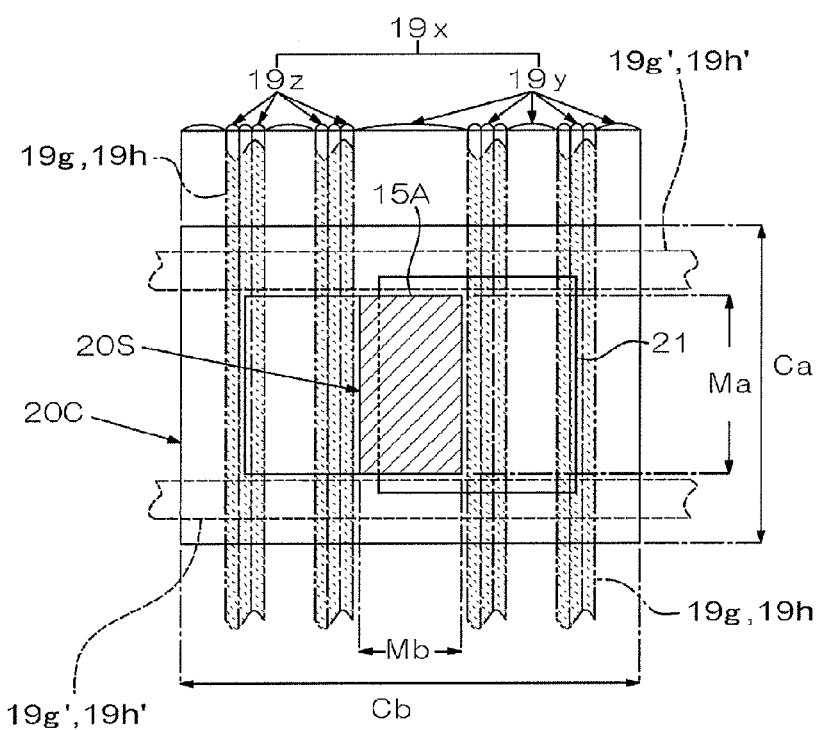
FIG. 18 is a schematic diagrammatic plan view for illustrating a positional relationship between an MEMS structure and the bumpy structure of the cover.

FIG. 18 is an illustration showing a relationship between the MEMS structure 20, and the inner surface 19*x* of the cover D facing the cavity C, within the covering range. Herein, as well as flat surface regions 19*y* being provided on the inner surface 19*x*, as heretofore described, bumpy surface regions 19*z* are provided using the bumpy structure. The bumpy surface regions 19*z*, by the rib shaped portions 19*g* and the groove shaped portions 19*h* being formed on the inner surface 19*x*, correspond to portions in which slopes and steps exist on the inner surface 19*x*. In a case in which the rib shaped portions 19*g* and the groove shaped portions 19*h* are formed of only sloped surfaces and stepped surfaces all over in a width direction thereof, formation ranges of the rib shaped portions 19*g* or groove shaped portions 19*h* are all made the bumpy surface regions 19*z* and, in a case in which flat surface portions exist in central portions of the rib shaped portions 19*g* and groove shaped portions 19*h*, as in the illustrated example, the bumpy surface regions 19*z* are provided one at either edge of each set of rib shaped portion and groove shaped portion. Also, portions of the inner surface 19*x* other than the bumpy surface regions 19*z* are the flat surface regions 19*y*.

As shown in FIG. 18, the bumpy surface regions 19*z* do not exist within the movable plane range 20S of the inner surface 19*x*, and the whole of the movable plane range 20S is the flat surface region 19*y*. In this case, when the movable plane range 20S is formed in an Ma vertical>Mb horizontal, vertically long shape, as shown in the figure, it is preferable to form the bumpy surface regions 19*z* in such a way as to extend outside the movable plane range 20S in a vertical direction which is a longitudinal direction of the movable plane range 20S, that is, to form the rib shaped portions 19*g* and groove shaped portions 19*h* on the inner surface 19*x* in such a way as to cross the covering range 20C in the longitudinal direction (vertical direction) Herein, as is the case with the heretofore described, it is more desirable that the bumpy surface regions 19*z*, or the rib shaped portions 19*g* and groove shaped portions 19*h* on the inner surface, are provided on either side of the movable plane range 20S.

According to the heretofore described configuration, by the bumpy surface regions 19z not being provided, and only the flat surface regions 19y existing, it is possible to, while increasing the rigidity of the cover D in the covering range 20C, avoid an effect of the bumpy structure in the movable plane range 20S on the movable portion 15A. In particular, as in the illustrated example, in a case in which a longitudinal direction of a covering range 20C formed in a Ca vertical<Cb horizontal, horizontally long shape intersects (is perpendicular to) the longitudinal direction of the movable plane range 20S, it is possible to configure almost without reducing the rigidity of the whole of the cover D.

Meanwhile, as shown by the broken lines in FIG. 18, in a case in which rib shaped portions 19g' or groove shaped portions 19h', including the bumpy surface regions, are provided in such a way as to cross in a direction intersecting (perpendicular to) the longitudinal direction of the movable plane range 20S, the rigidity of the cover D is likely to be reduced. In particular, as in the illustrated example, in the event that the rib shaped portions 19g' and the groove shaped portions 19h' are provided in such a way as to cross in the longitudinal direction of the covering range 20C formed in the Ca vertical<Cb horizontal, horizontally long shape, an advantage of the improvement in the rigidity of the cover D by the bumpy structure can hardly be expected.

The entire disclosures of Japanese Patent Application No. 2008-004037, filed Jan. 11, 2008, and Japanese Application No. 2008-300523, filed Nov. 26, 2008, are expressly incorporated by reference herein.

What is claimed is:

1. A functional device comprising:
a substrate;
a functional structure formed on the substrate;
a cavity in which the functional structure is disposed; and
a cover which covers the cavity to enclose the cavity, such that the cavity is sealed,
wherein the cover comprises:
a bumpy structure comprising ribs or grooves, which cross a covering range covering at least the cavity;
wherein the functional structure comprises an element with a movable portion on a side of the functional structure facing the cover;
wherein a plan view of the cover consists of
a first range which overlaps the element, and
a second range which does not overlap the element; and
wherein the first range is a flat surface region which includes no slopes or steps provided by the ribs or the grooves on an inner surface of the cover at the first range.

2. The functional device according to claim 1, wherein the ribs or grooves are collateral to each other.

3. The functional device according to claim 2, wherein the ribs or grooves are configured in a corrugated form in at least the covering range.

4. The functional device according to claim 1, wherein the cavity is depressurized and sealed.

5. A functional device, comprising:
a substrate;
a functional structure formed on the substrate;
a cavity in which the functional structure is disposed; and
a cover which covers the cavity to enclose the cavity, such that the cavity is sealed, wherein the cover comprises:
a bumpy structure comprising ribs or grooves, which cross a covering range covering at least the cavity, wherein the ribs or grooves are formed on an inner surface of the cover facing the cavity;
wherein the functional structure comprises an element with a movable portion on a side of the functional structure facing the cover;
wherein a plan view of the cover consists of
a first range which overlaps the element, and
a second range which does not overlap the element; and
wherein
the ribs or grooves are disposed in the second range, and
no ribs or grooves are disposed in the first range.

6. The functional device according to claim 5, wherein the ribs or grooves are collateral to each other.

7. The functional device according to claim 6, wherein the ribs or grooves are configured in a corrugated form in at least the covering range.

8. The functional device according to claim 5, wherein the cavity is depressurized and sealed.

9. A functional device, comprising:
a substrate;
a functional structure formed on the substrate;
a cavity in which the functional structure is disposed; and
a cover which covers the cavity to enclose the cavity, such that the cavity is sealed,
wherein the cover comprises:
a first cover layer, formed on a cavity side, which comprises apertures facing the cavity, and
a bumpy structure
provided on the first cover layer
comprising ribs or grooves, which cross a covering range covering at least the cavity; and
a second cover layer, which closes the apertures of the first cover layer;
wherein the functional structure comprises an element with a movable portion,
wherein a plan view of the cover consists of
a first range which overlaps the element, and
a second range which does not overlap the element; and
wherein the apertures are disposed in the second range,
wherein no apertures are disposed in the first range.

10. The functional device according to claim 9, wherein the ribs or grooves are collateral to each other.

11. The functional device according to claim 10, wherein the ribs or grooves are configured in a corrugated form in at least the covering range.

12. The functional device according to claim 9, wherein the cavity is depressurized and sealed.

* * * * *